(12) United States Patent
Tankielun

(10) Patent No.: US 12,399,204 B2
(45) Date of Patent: Aug. 26, 2025

(54) MODULAR ANTENNA WITH MOUNTING MODULE

(71) Applicant: Rohde & Schwarz GmbH & Co. KG, Munich (DE)

(72) Inventor: Adam Tankielun, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 266 days.

(21) Appl. No.: 18/181,392

(22) Filed: Mar. 9, 2023

(65) Prior Publication Data

US 2024/0302418 A1  Sep. 12, 2024

(51) Int. Cl.
*H01Q 1/12* (2006.01)
*G01R 29/08* (2006.01)

(52) U.S. Cl.
CPC ........... *G01R 29/0864* (2013.01); *H01Q 1/12* (2013.01)

(58) Field of Classification Search
CPC ............................ H01Q 1/12; G01R 29/0864
See application file for complete search history.

(56) References Cited

U.S. PATENT DOCUMENTS

| 7,528,358 | B2* | 5/2009 | Huang | G01R 29/0885 |
| | | | | 250/214.1 |
| 2004/0155824 | A1* | 8/2004 | Nagashima | G01R 29/10 |
| | | | | 343/703 |
| 2012/0221277 | A1* | 8/2012 | Gregg | H04B 17/11 |
| | | | | 702/106 |
| 2018/0205821 | A1* | 7/2018 | Rowell | H04W 4/20 |
| 2018/0323888 | A1* | 11/2018 | Rowell | H04B 7/0413 |
| 2023/0052735 | A1* | 2/2023 | Chang | H01Q 5/22 |

* cited by examiner

*Primary Examiner* — Hai V Tran
(74) *Attorney, Agent, or Firm* — CHRISTENSEN O'CONNOR JOHNSON KINDNESS PLLC

(57) ABSTRACT

A mounting apparatus for a modular antenna is described, wherein the mounting apparatus is attachable to a plurality of different radiation apparatus or modules and/or to a plurality of different feeding apparatus or modules. The mounting apparatus has a surface facing a measurement direction, wherein the surface is configured such that a surface parameter of the mounting apparatus is smaller than a predefined threshold, wherein the surface parameter is associated with a ratio of a first projected area and a second projected area. The first projected area corresponds to an area confined by the surface of the mounting apparatus facing the measurement direction and projected onto a plane being perpendicular to the measurement direction. The second projected area corresponds to an aperture of the modular antenna projected onto the plane being perpendicular to the measurement direction. Further, a modular antenna and an over-the-air measurement system are described.

14 Claims, 5 Drawing Sheets

24

24

24

24

24

24

24

24

24

(state of the art)

(state of the art)

MODULAR ANTENNA WITH MOUNTING MODULE

FIELD OF THE DISCLOSURE

Embodiments of the present disclosure generally relate to a mounting module for a modular antenna. Further, embodiments of the present disclosure relate to a modular antenna as well as to an over the air (OTA) measurement system.

BACKGROUND

In the state of the art, modular antennas and OTA measurement systems are known. Typically, measurement applications require various antenna radiation characteristics. However, there is no antenna that is optimal for all applications, as the required radiation characteristics can be contradictory at times. Antenna characteristics are mainly defined by the radiation part of the antenna. Hence, most OTA measurement systems require multiple different types of antennas. However, many basic measurement antennas comprise two parts, namely a feeding part and a radiation part. These two parts are often integrated without the possibility of detachment.

In order to reduce costs, modular antennas are known. These antennas comprise an interface flange which provides for mounting modularity and reduces the amount of parts needed for an OTA measurement system. However, the mounting part of modular antennas has a substantial surface area in relation to the antenna cross section. Hence, the cross section of the mounting module can lead to unwanted reflections towards a device under test (DUT), e.g., an antenna under test (AUT), as well as to the creation of a standing wave between the DUT and the measurement antenna. The resulting reflections and standing wave effect decrease the measurement accuracy and influence the results of the OTA measurement system.

Therefore, there is a need for a modular antenna which can be used in OTA measurement systems while providing the same amount of accuracy as a common antenna would. Further, there is a need to decrease the costs of OTA measurement systems.

SUMMARY

Embodiments of the present disclosure provide a mounting module for a modular antenna with the mounting module being attachable to a plurality of different radiation modules and/or to a plurality of different feeding modules. In an embodiment, the mounting module has a surface facing towards a measurement direction, wherein the surface of the mounting module facing towards the measurement direction is configured such that a surface parameter of the mounting module is smaller than a predefined threshold. The surface parameter is associated with a ratio of a first projected area and a second projected area. The first projected area corresponds to an area confined by the surface of the mounting module facing towards the measurement direction and projected onto a plane which is perpendicular to the measurement direction. The second projected area corresponds to an aperture of the modular antenna which is projected onto the plane perpendicular to the measurement direction.

The present disclosure is based on the main idea that an electromagnetic cross section, for example a radar cross section, of a mounting module is limited by reducing the transverse surfaces (of components involved) towards a measurement direction in relation to the antenna aperture.

In some embodiments, the first projected area is a measure for the portion of the surface of the mounting module extending transversally to the measurement direction, i.e., for the portion of the surface that mainly causes perturbations during measurements.

Accordingly, the surface of the mounting module may be configured such that the surface parameter is reduced compared to common mounting modules, for example such that the surface parameter is as small as possible.

Accordingly, an absolute reduction is obtained, namely an absolute reduction of the transverse surfaces of the mounting module, namely its surface area. Consequently, unwanted reflections towards a device under test (DUT), e.g. an antenna under test (AUT), as well as to the creation of a standing wave between the DUT and the measurement antenna can be avoided.

Embodiments of the present disclosure further provide a modular antenna comprising a mounting module according to the present disclosure, a feeding module, and a radiation module.

Furthermore, embodiments of the present disclosure provide an OTA measurement system comprising at least one modular antenna according to the present disclosure.

Examples of the mounting module according to the present disclosure provide increased system flexibility in regards to modular antennas and OTA measurement systems. Since a variety of combinations between feeding modules and radiation modules is possible due to the mounting module, the costs of the overall system are reduced as well.

In some embodiments, the radiation module of the modular antenna can be changed according to the required radiation characteristics provided by the present OTA measurement without having to replace the feeding module of the modular antenna.

Moreover, the measurement accuracy and results of the OTA measurement system are improved, since the reduced electromagnetic cross section of the disclosed mounting module prevents the creation of standing waves, which could possibly impact the measurement results negatively. Further, reflections impairing the OTA measurements are reduced.

In order to improve the results, the predefined threshold of the surface parameter in some embodiments is smaller than or equal to 3.5. Even more accurate measurement results can be obtained, when the predefined threshold of the surface parameter is smaller than or equal to 3. In some embodiments, the predefined threshold of the surface parameter is a number smaller than or equal to 1, since this ensures the most accurate measurement results of the OTA measurement system.

The possibility of standing waves is decreased even further by covering all portions of the mounting module that extend transverse to the measurement direction with an absorber. While there are many different ways how the absorber can be arranged, using absorbers having triangular shapes has proved most effective.

Besides the standing wave effects, interference between the signal used for measurements and reflected electromagnetic waves has also been shown to decrease the measurement accuracy. The reflection coefficient of dielectric materials with a relative permittivity smaller than 1.5 was found to be negligible. For that reason, the mounting module may at least partially comprise of a dielectric material having a dielectric constant smaller than or equal to, for example, 1.5.

In some embodiments, only a portion of the mounting module having a dielectric constant greater than 1.5 may be considered for the surface parameter. Accordingly, portions of the mounting module consisting of the dielectric material having a dielectric constant smaller than or equal to 1.5 do not contribute to the surface parameter.

Further, portions of the mounting module, which could lead to reflections of electromagnetic waves to other parts of the mounting module, are also covered with an absorber. Accordingly, multiple reflections of electromagnetic waves off the mounting module are reduced such that the accuracy of measurement results is further improved.

In order to provide a secure connection between the feeding module and the radiation module, the mounting module may comprise at least one flange. Hence, the mounting module is attachable to a plurality of different radiation modules and/or to a plurality of different feeding modules by the at least that one flange.

The costs resulting from the need of different antennas to be used in an OTA measurement system can be avoided by the mounting module being standardized. That way, it can be ensured that all feeding modules fit all radiation modules with the help of the mounting module.

According to one embodiment of the present disclosure, the mounting module can be integrated into the feeding module or into the radiation module. This still provides a flexibility regarding the antenna types while reducing the number of parts needed.

An alternative embodiment of the present disclosure provides the mounting module as a part, which is established separately from the feeding module and the radiation module. This ensures that all combinations between different radiation and feeding modules are possible, without having to worry whether a feeding module with an integrated mounting module has to be combined with a radiation module having an integrated mounting module.

In some embodiments, a surface area and/or a cross section of the feeding module may be circular or rectangular. Since those are the most common shapes of feeding modules for antennas, they do not limit the flexibility provided by the mounting module.

Further, the mounting module is connected with the radiation module and/or with the feeding module through a thread, a bayonet mount, at least one screw, at least one bolt, or a snap-in in order to provide a modular antenna.

Moreover, other types of (detachable) connections may also be used for connecting the mounting module with the radiation module and/or with the feeding module, e.g., a compression fitting, a flare fitting, a flange fitting, a push fitting, a rubber sleeve fitting or a bushing connector. However, it is to be understood that any other suitable type of connection may be used.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
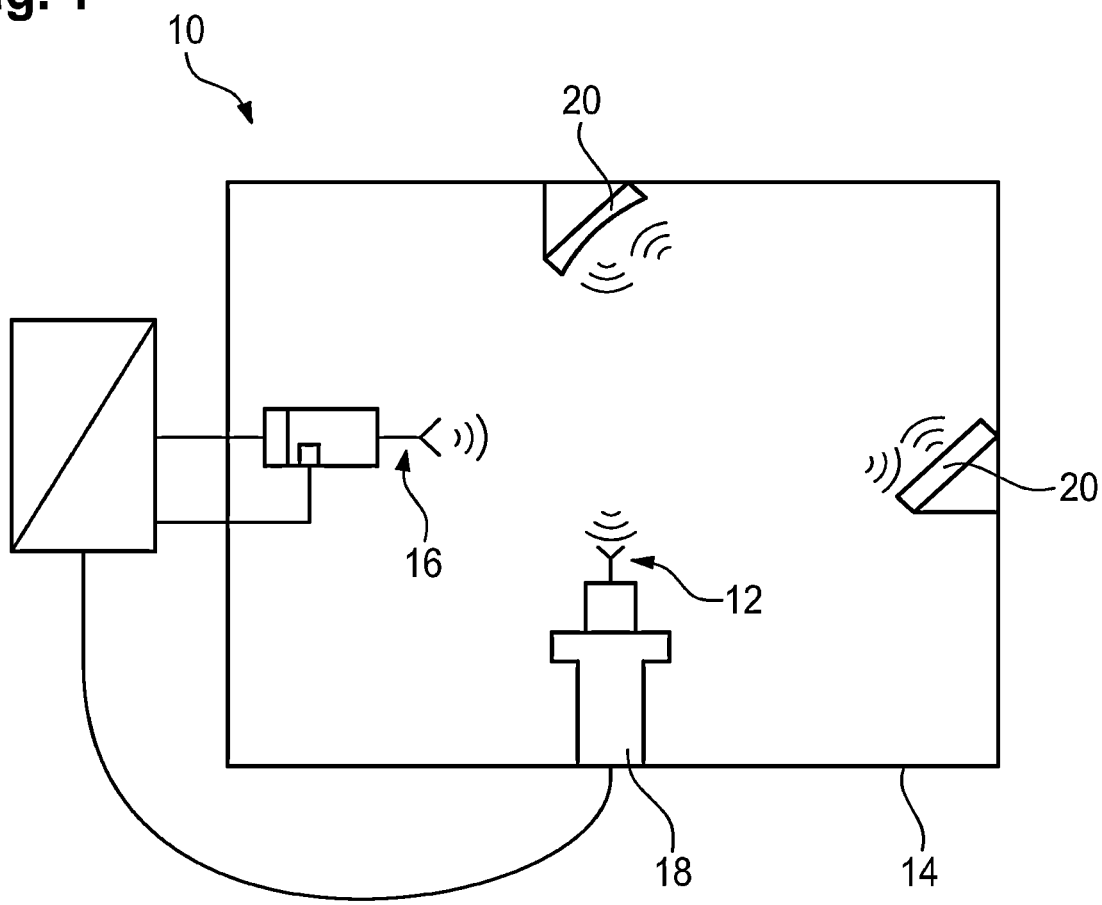
FIG. 1 schematically shows an example of an OTA measurement system according to an embodiment of the present disclosure, and comprises a modular antenna according to the present disclosure.

FIG. 1 depicts an over the air (OTA) measurement system 10 that is used for testing an antenna under test (AUT) 12. Generally, the over the air (OTA) measurement system 10 may be used to test a device under test that is different to an antenna under test 12, e.g. a device having an antenna.

In the embodiment shown, the OTA measurement system 10 comprises a shielded chamber 14 that accommodates the AUT 12 as well as a modular antenna 16 that is used for testing the AUT 12. The modular antenna 16 is part of the OTA measurement system 10. In general, the shielded chamber 14 is configured to shield an interior space of the shielded chamber 14 from external electromagnetic waves that may disturb or rather affect the measurements, thereby lowering the accuracy of the measurement results.

In some embodiments, the shielded chamber 14 may be an anechoic chamber, i.e., inner surfaces of the shielded chamber 14 may be covered with anti-reflection components, such as absorbers, that are configured to reduce reflections within the interior space of the shielded chamber.

The OTA measurement system 10 may also comprise a positioner system 18 for aligning the AUT 12 as well as two reflectors 20.

The OTA system 10 shown in the embodiment of FIG. 1 is a multi-reflector system, but any other type of OTA measurement system can be used as well.

Figure 2:
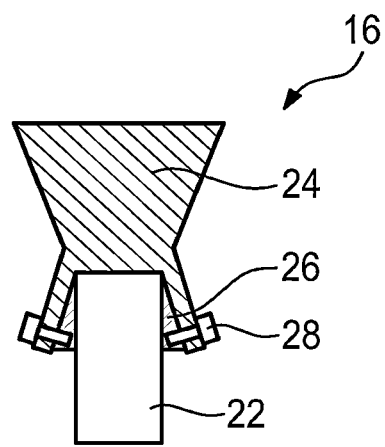
FIG. 2 schematically illustrate a side view of a modular antenna according to an embodiment of the present disclosure.
Figure 3A:
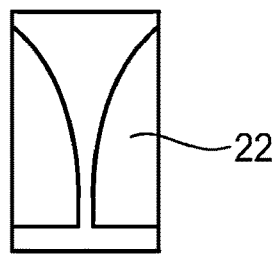
FIGS. 3A to 3E schematically illustrate side views of various modular antennas according to one or more embodiments of the present disclosure, respectively.
Figure 3B:
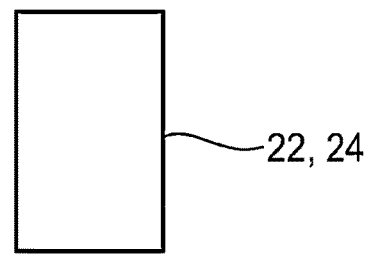
Figure 3C:
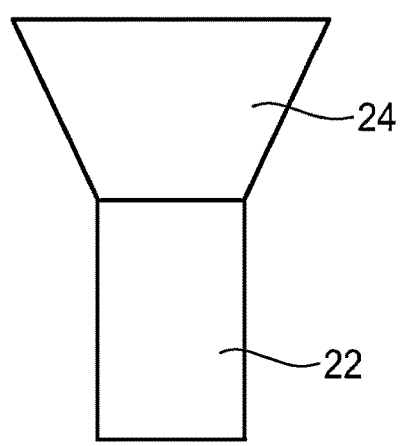
Figure 3D:
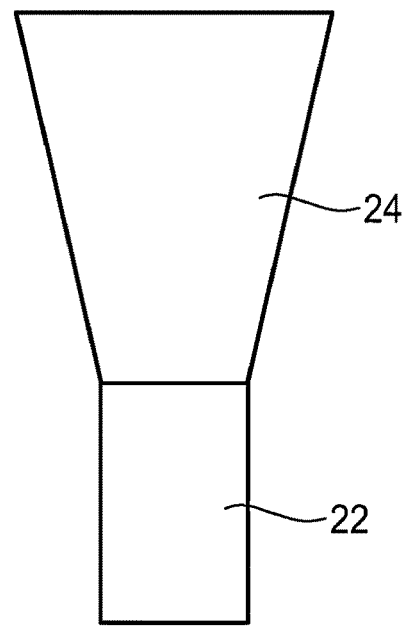
Figure 3E:
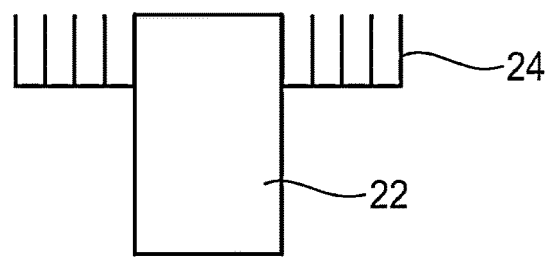
Figure 4A:
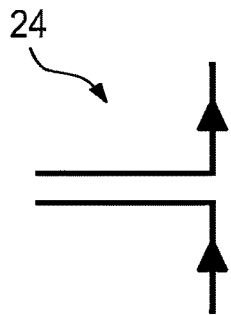
FIGS. 4A to 4I schematically illustrate examples of a radiation module of a modular antenna according to an embodiment of the present disclosure, respectively.
Figure 4B:
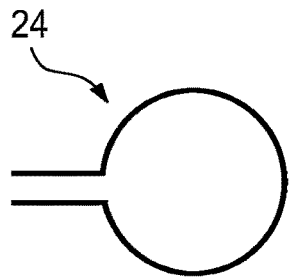
Figure 4C:
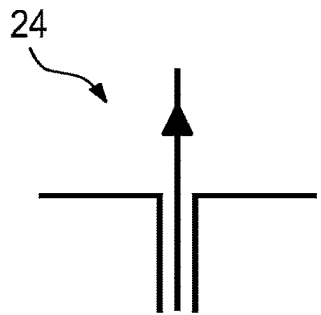
Figure 4D:
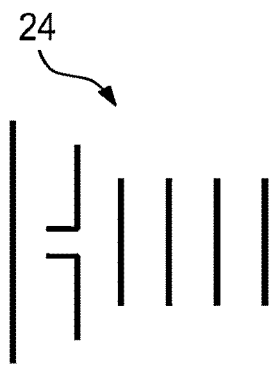
Figure 4E:
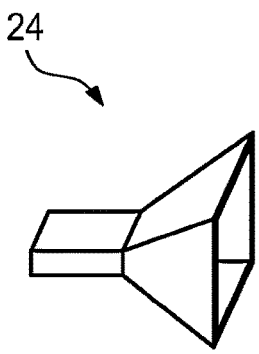
Figure 4F:
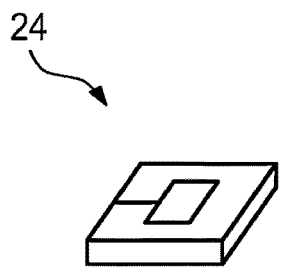
Figure 4G:
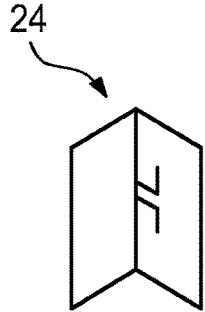
Figure 4H:
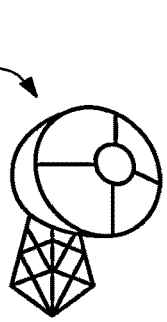
Figure 4I:
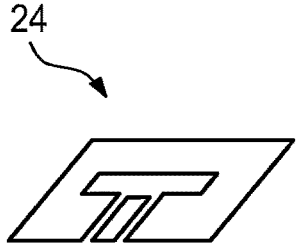

One example of the modular antenna 16 used in the OTA measurement system 10 is shown in FIG. 2. As shown in FIG. 2, the modular antenna 16 comprises a feeding module 22, a radiation module 24, and a mounting module 26. In the example embodiment shown in FIG. 2, the mounting module 26 is integrated into the feeding module 22, while the radiation module 24 is secured to the mounting module 26 through two bolts 28. Instead of bolts 28, bars, rods or similar may be used.

Depending on the measurement application, different kinds of radiation characteristics are needed. These are mainly defined by the radiation module 24 of the modular antenna 16. Some of the characteristics that are needed for OTA measurement systems are broadband antennas, antennas with low, medium, or high directivity and antennas with a high radial cross-section and low side-lobes, as shown in FIG. 3A to 3E, respectively.

In general, a surface area of the feeding module 22 may be circular or rectangular. Likewise, a cross section of the feeding module 22 may be circular or rectangular. Other shapes may be practiced with embodiments of the present disclosure.

The radiation module 24 depicted in FIG. 2 is only an example. Any other type of radiation module 24 like a wire dipole, a loop, a wire monopole, a Yagi-Uda ray, a horn, a microstrip patch, a corner reflector, a slot, or a parabolic reflector (dish), as shown in FIGS. 4A to 4I respectively, can be used as well.

Further, the connection between the different modules can also be given by means of threads 40, bayonet mounts 42, snap-ins 44, or screws 46, as is shown in FIGS. 7A to 7D.

Other types of (detachable) connections be used for connecting the mounting module 26 with the radiation module 24 and/or with the feeding module 22 comprise a compression fitting, a flare fitting, a flange fitting, a push fitting, a rubber sleeve fitting, a bushing connector, etc.

Generally, the mounting module 26 is capable of being attached to a plurality of different radiation modules and/or to a plurality of different feeding modules, thereby ensuring the modularity for the modular antenna 16.

Figure 6A:
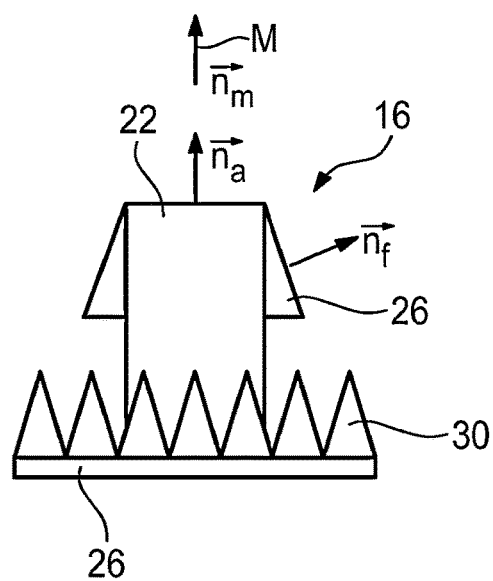
FIGS. 6A and 6B schematically illustrate a side view and a top view of a modular antenna according to an embodiment of the present disclosure, respectively.

In some embodiments, the mounting module 26 of the modular antenna 16 can also at least partially be covered with an absorber 30, as is shown e.g., in FIG. 6A.

In order to improve the accuracy of measurement results obtained by OTA measurement systems, e.g., by the OTA measurement system 10 depicted in FIG. 1, the amount of standing waves and unwanted reflected signals has to be reduced.

Figure 5A:
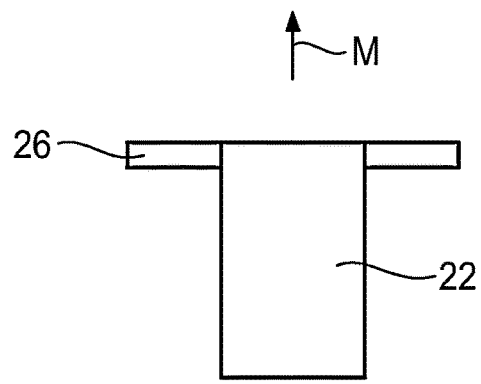
FIGS. 5A and 5B schematically illustrate a side view and a top view of a state of the art modular antenna, respectively.
Figure 5B:
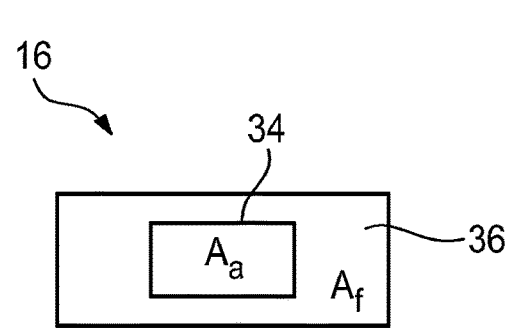
Figure 6B:
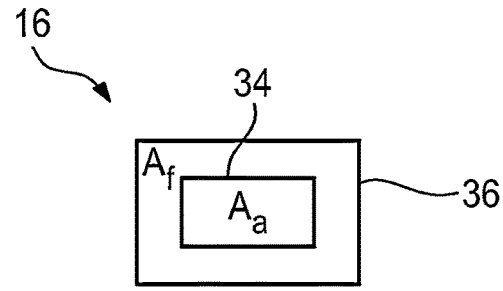
Figure 7A:
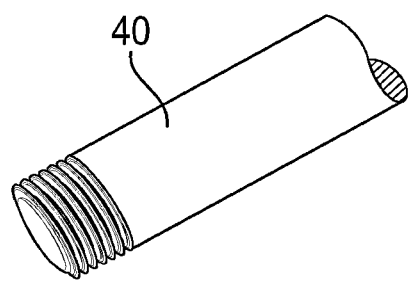
FIGS. 7A to 7D schematically illustrate a variety of fasteners, which can be used to connect the different modules of the modular antenna according to embodiments of the present disclosure.
Figure 7B:
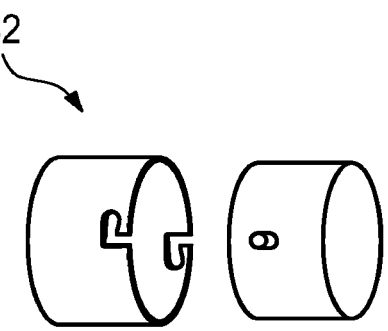
Figure 7C:
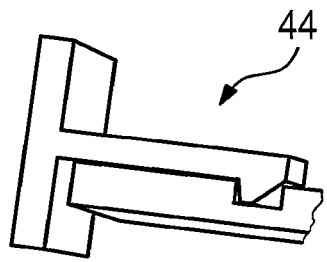
Figure 7D:
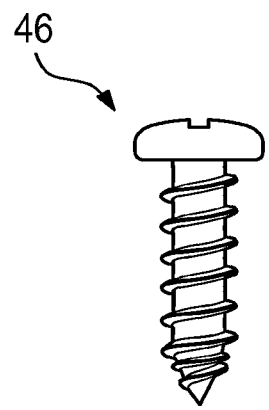

As is illustrated in FIGS. 6A, and 6B, this is achieved by limiting an electromagnetic cross section of the mounting module 26 compared to common mounting modules known in the state of the art of FIGS. 5A, 5B. It will be appreciated that the radiation module 24 is not shown in FIGS. 5A, 5B, 6A, and 6B for illustration purposes.

This is done by reducing transverse surfaces of the mounting module 26 facing towards a measurement direction M in relation to an antenna aperture 34. For example, a surface parameter R_fa is reduced in order to be smaller than a predefined threshold, e.g., smaller than or equal to 3.5, smaller than or equal to 3 or even smaller than or equal to 1.

In some embodiments, the surface parameter R_fa is minimized.

The surface parameter R_fa is associated with a ratio of a first projected area and a second projected area, and is given by the following equation:

$$R\_fa = \left( \iint (n\_f \cdot n\_m \, dA\_f) \right) / \left( \iint (n\_a \cdot n\_m \, dA\_a) \right)$$

where n_m is a unit vector in measurement direction M, n_a is a unit vector in a direction normal to the antenna aperture 34, and n_f is a unit vector in a direction normal to the surface of the mounting module 26.

Therein the integral $\iint (n\_f \cdot n\_m \, dA\_f)$ is evaluated over an area A_f confined by the surface of the mounting module 26 facing towards the measurement direction M.

The integral $\iint (n\_a \cdot n\_m \, dA\_a)$ is evaluated over the aperture 34 having an area A_a.

Accordingly, the first projected area, namely the numerator of above-mentioned fraction defining the surface parameter R_fa, corresponds to the area confined by the surface of the mounting module 26 facing towards the measurement direction M and projected onto a plane that is perpendicular to the measurement direction M.

Further, the second projected area, namely the denominator of above-mentioned fraction defining the surface parameter R_fa, corresponds to the aperture 34 of the modular antenna 16 projected onto a plane being perpendicular to the measurement direction M.

The first projected area and the second projected area are put in relation with each other, thereby defining the ratio.

This ratio can, for example, be effectively minimized by placing the surface of the mounting module 26 at an angle θ. Steep angles θ in regards to measurement direction M are preferred, since they have the biggest impact when it comes to reducing the surface parameter R_fa.

While surface parameter R_fa relates to the placement of the surface area A_a of the antenna aperture 34 and surface area A_f of the mounting module 26, during operation, a reduced surface parameter R_fa leads to an increased signal strength. By having slanted mounting surfaces a flux of unwanted reflected electromagnetic waves is reduced, which could interfere with the measurement signal.

However, sometimes it is unavoidable to have a transverse mounting surface 36 towards the measurement direction M. In that case, it is advisable to use dielectric materials with a relative permittivity smaller than 1.5. These materials are transparent enough in regards to electromagnetic radiation as to not reflect electromagnetic waves, i.e., they are transparent in regards to electromagnetic waves and therefore let them pass through. For that particular reason, dielectric materials having a dielectric constant smaller than or equal to 1.5 are assumed to not contribute to the surface parameter R_fa.

Alternatively and/or additionally, the mounting surface 36 can at least partially be covered by absorbers 30. It has been found that the most effective absorber shape for electromagnetic waves is a pyramid module for low frequencies while a cone shape is nearly as effective at higher frequencies.

Generally, absorbers can be considered as a vertically gradient structure. In order to preserve the flexibility of the OTA measurement system 10, the absorbers 30 may be broadband absorbers. Generally, though, it is also possible to use resonant absorbers.

Since multiple modular antennas 16 might be used in the OTA measurement system 10, all portions of the mounting module 26 which might lead to reflections of electromagnetic waves should be covered with absorbers 30. In other words, also surfaces that might not directly contribute to the surface parameter R_fa should be taken into consideration when placing absorbers 30.

Further, mounting module 26 can be standardized, such that it is universally usable for different feeding modules 22 and radiation modules 24 as already indicated above. This is especially cost-effective, since the feeding module 22 is usually the most complicated and expensive part of the modular antenna 16. By having a standardized mounting module 26, it would be possible to only replace the feeding module 22 when it is absolutely necessary and not each time a different antenna type is needed. Instead, it would be possible to simply switch out the radiation module 24 of the modular antenna 16 which is usually the cheaper solution.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A mounting apparatus for a modular antenna, the mounting apparatus being attachable to a plurality of different radiation modules and/or to a plurality of different feeding modules,
    wherein the mounting apparatus, a radiation module of the plurality of different radiation modules, and a feeding module of the plurality of different feeding modules are combinable to form the modular antenna,
    wherein the radiation module defines radiation characteristics of the modular antenna,
    wherein the mounting apparatus has a surface facing towards a measurement direction,
    wherein the surface of the mounting apparatus facing towards the measurement direction is configured such that a surface parameter of the mounting apparatus is smaller than a predefined threshold,
    wherein the surface parameter is associated with a ratio of a first projected area and a second projected area,
    wherein the first projected area corresponds to an area confined by the surface of the mounting apparatus facing towards the measurement direction and projected onto a plane that is perpendicular to the measurement direction,
    wherein the second projected area corresponds to an aperture of the modular antenna projected onto the plane being perpendicular to the measurement direction, and
    wherein the predefined threshold is a number being smaller than or equal to 3.5.

2. The mounting apparatus of claim 1, wherein the predefined threshold is a number being smaller than or equal to 3.

3. The mounting apparatus of claim 1, wherein the predefined threshold is a number being smaller than or equal to 1.

4. The mounting apparatus according to claim 1, wherein portions of the mounting apparatus that extend transverse to the measurement direction are covered with an absorber.

5. The mounting apparatus according to claim 1, wherein the mounting apparatus at least partially comprises a dielectric material having a dielectric constant smaller than or equal to 1.5.

6. The mounting apparatus of claim 1, wherein portions of the mounting apparatus leading to reflections of electromagnetic waves to other portions of the mounting apparatus are covered with an absorber.

7. The mounting apparatus according to claim 1, wherein the mounting apparatus comprises at least one flange, wherein the mounting apparatus is attachable to the plurality of different radiation modules and/or to the plurality of different feeding modules by the at least one flange.

8. The mounting apparatus according to claim 1, wherein the mounting apparatus is standardized.

9. A modular antenna comprising:
    a mounting apparatus;
    a feeding module selected from a plurality of different feeding modules; and
    a radiation module selected from a plurality of different radiation modules;
    wherein the mounting apparatus, the radiation module, and the feeding module constitute the modular antenna,
    wherein the radiation module defines radiation characteristics of the modular antenna,
    wherein the mounting apparatus is attachable to the plurality of different radiation modules and/or to the plurality of different feeding modules,
    wherein the mounting apparatus has a surface facing towards a measurement direction,
    wherein the surface of the mounting apparatus facing towards the measurement direction is configured such that a surface parameter of the mounting apparatus is smaller than a predefined threshold,
    wherein the surface parameter is associated with a ratio of a first projected area and a second projected area,
    wherein the first projected area corresponds to an area confined by the surface of the mounting apparatus facing towards the measurement direction and projected onto a plane that is perpendicular to the measurement direction,
    wherein the second projected area corresponds to an aperture of the modular antenna projected onto the plane being perpendicular to the measurement direction, and
    wherein the predefined threshold is a number being smaller than or equal to 3.5.

10. The modular antenna according to claim 9, wherein the mounting apparatus is integrated into the feeding module or into the radiation module.

11. The modular antenna according to claim 9, wherein the mounting apparatus is established separately from the feeding module and the radiation module.

12. The modular antenna according to claim 9, wherein a surface area and/or a cross section of the feeding module is circular or rectangular.

13. The modular antenna according to claim 9, wherein the mounting apparatus is connected with the radiation module and/or with the feeding module through a thread, a bayonet mount, at least one screw, at least one bolt, or a snap-in.

14. An over-the-air (OTA) measurement system comprising a modular antenna, the modular antenna comprising:
    a mounting apparatus;

a feeding module selected from a plurality of different feeding modules; and a radiation module selected from a plurality of different radiation modules;

wherein the mounting apparatus, the radiation module, and the feeding module constitute the modular antenna, wherein the radiation module defines radiation characteristics of the modular antenna, wherein the mounting apparatus is attachable to the plurality of different radiation modules and/or to the plurality of different feeding modules, wherein the mounting apparatus has a surface facing towards a measurement direction, wherein the surface of the mounting apparatus facing towards the measurement direction is configured such that a surface parameter of the mounting apparatus is smaller than a predefined threshold, wherein the surface parameter is associated with a ratio of a first projected area and a second projected area, wherein the first projected area corresponds to an area confined by the surface of the mounting apparatus facing towards the measurement direction and projected onto a plane that is perpendicular to the measurement direction, wherein the second projected area corresponds to an aperture of the modular antenna projected onto the plane being perpendicular to the measurement direction, and wherein the predefined threshold is a number being smaller than or equal to 3.5.

* * * * *